United States Patent
Foo

(10) Patent No.: US 7,081,772 B1
(45) Date of Patent: Jul. 25, 2006

(54) OPTIMIZING LOGIC IN NON-REPROGRAMMABLE LOGIC DEVICES

(75) Inventor: Loke-Yip Foo, Ipoh (MY)

(73) Assignee: Altera Corporation, San Jose, CA (US)

( * ) Notice: Subject to any disclaimer, the term of this patent is extended or adjusted under 35 U.S.C. 154(b) by 53 days.

(21) Appl. No.: 10/861,585

(22) Filed: Jun. 4, 2004

(51) Int. Cl.
*H03K 19/177* (2006.01)

(52) U.S. Cl. .............................. 326/38; 326/40; 326/41
(58) Field of Classification Search ................ 326/38, 326/39, 42, 44, 41, 40; 716/19; 257/206
See application file for complete search history.

(56) References Cited

U.S. PATENT DOCUMENTS

| | | | | |
|---|---|---|---|---|
| 3,549,871 A * | 12/1970 | Shinagawa et al. | ......... | 708/273 |
| 4,691,149 A * | 9/1987 | Baumgartner et al. | ...... | 388/809 |
| 5,055,716 A * | 10/1991 | El Gamel | ................... | 326/42 |
| 5,243,628 A * | 9/1993 | Moritoki et al. | ............ | 375/286 |
| 5,289,021 A * | 2/1994 | El Gamal | .................... | 257/206 |
| 5,341,041 A * | 8/1994 | El Gamal | .................... | 326/44 |
| 5,552,722 A * | 9/1996 | Kean | ............................ | 326/41 |
| 5,773,993 A * | 6/1998 | Trimberger | .................. | 326/38 |
| 5,825,202 A | 10/1998 | Tavana et al. | ................. | 326/39 |
| 5,874,834 A | 2/1999 | New | ............................. | 326/39 |
| 5,926,035 A * | 7/1999 | Raza | ............................ | 326/38 |
| 5,943,488 A * | 8/1999 | Raza | ............................ | 716/19 |
| 5,949,721 A * | 9/1999 | Kwon et al. | ........... | 365/189.11 |
| 6,091,262 A | 7/2000 | New | ............................. | 326/39 |
| 6,094,065 A | 7/2000 | Tavana et al. | ................. | 326/39 |
| 6,118,299 A * | 9/2000 | Raza | ............................ | 326/39 |
| 6,242,945 B1 | 6/2001 | New | ............................. | 326/39 |
| 6,490,707 B1 | 12/2002 | Baxter | ........................... | 716/2 |
| 6,515,509 B1 | 2/2003 | Baxter | .......................... | 326/39 |
| 6,526,563 B1 | 2/2003 | Baxter | .......................... | 716/18 |
| 6,943,581 B1 * | 9/2005 | Cruz et al. | ..................... | 326/41 |

OTHER PUBLICATIONS

K.Y. Tong et al., "Regular Logic Fabrics for a Via Patterned Gate Array (VPGA)," IEEE 2003 Custom Integrated Circuits Conference, Orlando, Florida, pp. 4-3-1 through 4-3-4, 2003, (no month).

Xilinx, *HardWire Data Book*, "XC3300 Family HardWire Logic Cell Arrays," Preliminary Product Specification, 1991, (no month).

Xilinx, *HardWire Data Book*, pp. 1-1 through 2-28, 1994, (month unknown).

* cited by examiner

*Primary Examiner*—Jean Bruner Jeanglaude
(74) *Attorney, Agent, or Firm*—Fish & Neave IP Group of Ropes & Gray LLP

(57) ABSTRACT

A method for reducing the amount of logic needed to perform logic operations in non-reprogrammable logic devices based on preexisting circuit designs is provided. The logic optimization method reduces die size and power consumption while increasing the performance of the logic device.

16 Claims, 4 Drawing Sheets

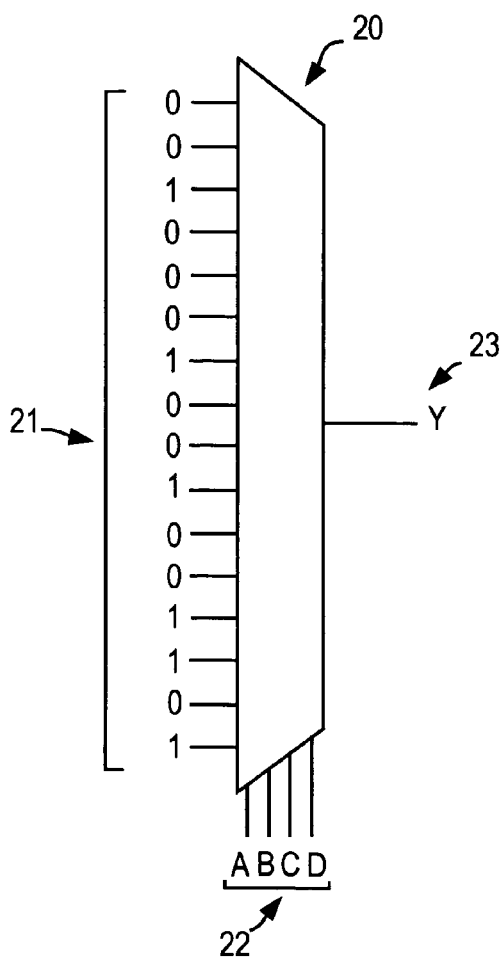

__US 7,081,772 B1__

OPTIMIZING LOGIC IN NON-REPROGRAMMABLE LOGIC DEVICES

BACKGROUND OF THE INVENTION

The present invention applies to non-reprogrammable logic devices. More particularly, this invention relates to methods of optimizing logic in non-reprogrammable logic devices.

Programmable logic devices (PLDs) are well known. Early programmable logic devices were one-time configurable. For example, configuration may have been achieved in a laser programmable device, for instance, by "burning"—i.e., opening—fusible links. Alternatively, the configuration may have been stored in a programmable read-only memory. These devices generally provided a user with the ability to configure the devices for "sum-of-products" (or "P-TERM") logic operations. Later, such programmable logic devices incorporated erasable programmable read-only memory (EPROM) for configuration became available, allowing the devices to be reconfigured.

Still later, programmable logic devices incorporating static random access memory (SRAM) elements for configuration became available. These devices, which can also be reconfigured, store their configuration information in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic resources in the device, and the interconnect resources for routing of signals between the logic resources, were programmable. Alternatively, non-reprogrammable or one-time programmable devices such as mask-programmable logic devices (MPLDs) have been provided. With mask-programmable logic devices, instead of selling all users the same device, a manufacturer produces a base device that depends on a user's specifications and that is not programmable by the user.

Specifically, the user provides the manufacturer of the mask-programmable logic device with the specifications of a desired device, which may be the configuration file for programming a comparable conventional programmable logic device ("source PLD"). The manufacturer then uses that information to program the logic functions of the base device and also to configure the routing of the device. Thus, unlike in a programmable logic device, where the same programmable interconnect resources are in every device, in a mask-programmable logic device the routing is configured by the manufacturer based on the user's specifications and can inevitably vary from device to device.

In addition, the logic resources for conventional programmable logic devices often contain generic look-up tables (LUTs) that allow the user to implement a desired logic function. However, as a result, these devices invariably include resources that are unoptimized or that may not be used for a particular design.

Accordingly, it would be desirable to provide a method for optimizing the area, performance, and power consumption of a non-reprogrammable logic device that implements a pre-existing circuit design by reducing the number of gates and logic levels needed to implement logic functions in such devices.

SUMMARY OF THE INVENTION

It is therefore an object of the present invention to provide a method for optimizing the die area, performance, and power consumption of a non-reprogrammable logic device that implements a pre-existing circuit design by reducing the total number of gates and logic levels needed to implement logic functions performed in such devices.

The present invention achieves this reduction by reducing the size of the look-up tables that implement the logic functions performed in these devices. Accordingly, it will be appreciated that this optimization results in reduced die size, reduced power consumption, and increased performance of a non-reprogrammable logic device.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which:

FIG. 2 is a logic diagram of the multiplexer that implements the unoptimized logic function provided in the example;

FIG. 3 is a truth table for the unoptimized example logic function;

FIG. 4 is a Karnaugh map for the unoptimized example logic function;

FIG. 5 is a truth table for an optimized form of the example logic function;

DETAILED DESCRIPTION OF THE PREFERRED EMBODIMENTS

The present invention reduces the die area and power consumption of a non-reprogrammable logic device, while increasing its performance and yield, by reducing the size of the look-up tables that implement the logic functions that are carried out by the non-reprogrammable logic device, thereby reducing the total number of gates that are needed to implement these functions. In doing so, it is possible to reduce the size of the individual logic elements that implement the various logic functions of the device and thus offer the same logic functionality in the non-reprogrammable logic device as the preexisting circuit design but at a reduced die size cost.

The invention will now be described with reference to FIGS. 1–14.

Figure 1:
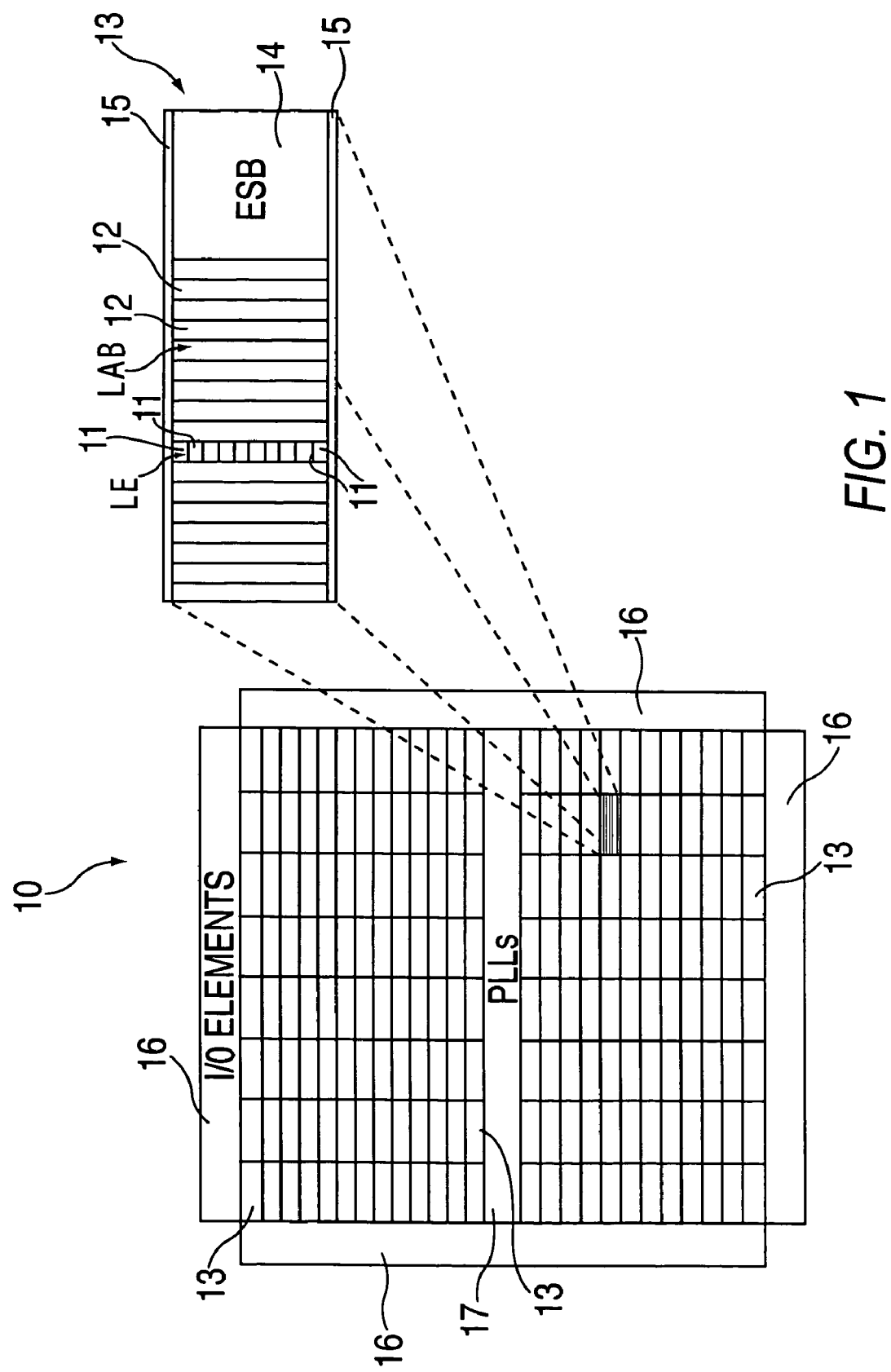
FIG. 1 is a block diagram representation of the layout of a preferred embodiment of a mask-programmable base device in accordance with the present invention.

As seen in FIG. 1, one embodiment of a non-reprogrammable logic device constructed in accordance with the present invention is mask-programmable base device 10. Mask-programmable base device 10 includes an array of logic resources similar to those found in the APEX® and Stratix® families of programmable logic devices (i.e., possible source devices) sold by Altera Corporation, of San Jose, Calif., the assignee hereof. Although an Apex® type architecture is shown, it will be understood that any type of programmable logic device (PLD), complex programmable logic device (CPLD), or other related device may serve as a model for the base device.

As shown in FIG. 1, the logic resources include, at the most basic level, "logic elements" (LEs) 11, which may be, for example, look-up table-based logic regions having four inputs and the ability to have registered or unregistered outputs. Logic elements 11 may be grouped into "logic array blocks" (LABs) 12. In the embodiment shown, each LAB 12 includes ten LEs 11, although other numbers of LEs 11 could be grouped into each LAB 12. The LABs 12 may be further grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" (ESB)) 14. Each GOL 13 may also include a plurality of gate array sites 15, which may be used, for example, for buffering, delaying, processing, and/or routing particular signals.

Moreover, it will be understood that LABs 12 need not be organized in GOLs 13, but may be spread throughout base device 10 in regular or irregular patterns. Some of these resources may be external to the core logic array. The specific organization of LEs 11 and LABs 12 on base die 10 is not crucial to the invention.

As shown, GOLs 13 may be arranged in an orthogonal array of rows and columns. "Input/output elements" (I/Os) are preferably located in regions 16 around the periphery of the array. Other auxiliary circuits, such as "phase-locked loops" (PLLs) (e.g., for timing), are preferably provided at convenient locations within the array, such as in region 17, shown in about the center of the array.

The optimization of an exemplary logic function will now be described in accordance with the invention. The following examples show how it is possible to reduce the size of LEs 11 in mask-programmable base device 10 by optimizing the logic functions that are implemented in the source PLD.

The Boolean expression below denotes an exemplary unoptimized logic function that may be implemented in the configuration file of a source PLD. The "A", "B", "C", and "D" symbols denote input signals to this logic function and may be either a logic 0 or a logic 1. The "Y" symbol denotes the output signal of the logic function and depending on the inputs may also be either a logic 0 or a logic 1. The "'" symbol denotes the logical NOT operator, and the "+" symbol denotes the logical OR operator. The logical AND operator is implicitly understood between two or more adjacent inputs.

$$Y=A'CD'+AC'D+ABC'+ABD$$

The above expression can be alternatively written in the following form, in which the parenthetical expressions denote the logical outputs of each adjacent subexpression.

$$Y=A'CD'(1)+AC'D(1)+ABC'(1)+ABD(1)$$

In this example, a logical 1 or TRUE signal is asserted at the output when, for instance, input A is not asserted, input C is asserted, and input D is not asserted.

Conventionally, the logic function above may be implemented in a single logic element 11 of base MPLD 10 by the 16-input multiplexer ("mux") 20 shown in FIG. 2. Multiplexer 20 contains input bits 21, select bits 22, and output bit 23. It acts as a 4-input look-up table, whereby input bits 21 may be wired either to programmable SRAM bits that correspond to a logic 0 or logic 1 or alternatively to ground and power directly. The inputs to the logic function—A, B, C, and D—are wired to select bits 22 of multiplexer 20. It is understood that this examplary logic function may be implemented by a single multiplexer or similarly by a multiplexer tree without departing from the scope of the invention.

In order to help better visualize the inputs and corresponding outputs of the unoptimized example function above, the truth table 30 and Karnaugh map 40 ("K-map") for the expression are shown in FIGS. 3 and 4 respectively. Such logic tables are well known to one of ordinary skill in the art and will not be explained in detail.

Figures 6, 7, 8, 9:
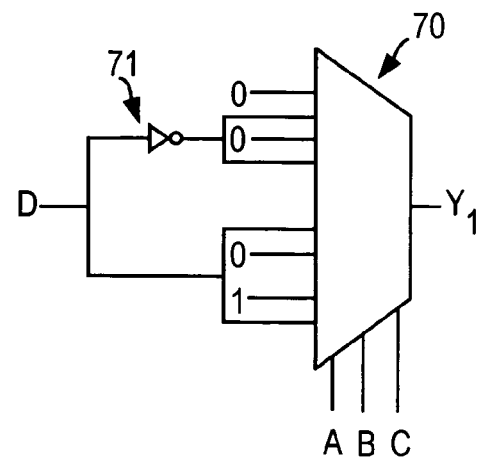
FIG. 6 is a Karnaugh map for an optimized form of the example logic function.
FIG. 7 is a logic diagram of the multiplexer that implements the logic function represented in FIG. 6.
FIG. 8 is a Karnaugh map for another optimized form of the example logic function.
FIG. 9 is a Karnaugh map for yet another optimized form of the example logic function.

One way of optimizing the above exemplary logic function is to move or shift one or more of the inputs of the logic function to the possible output selections of the logic function, thereby reducing the size of the LUT that implements the function. FIGS. 5 and 6 show truth table 50 and K-map 60, respectively, for one optimized version of the example expression in which input D is shifted to at least one of the possible output selections. As a result, the optimized expression now becomes a function of only the A, B, and C inputs. The logic expression for this optimized function is shown below.

$$Y=A'C(D')+AC'(D)+ABC'(1)+AB(D)$$

Since this optimized function generates an output selection based on only three of the inputs, it is possible to implement this function in a 3-input LUT using 8-input mux 70 shown in FIG. 7. Mux 70 contains only 3 select bits that are wired to inputs A, B, and C to the logic function. However, whereas the original unoptimized function outputted only a logic 0 or 1, the optimized function outputs one of four possible output selections depending on the input signals: 0, 1, D, or not D (D'). For example, if A is asserted and B is asserted, then the output selection of the LUT (mux 26) is input D. Thus, if D is a logic 0, then the output of mux 26 and of the logic function is a logic 0. On the other hand, if D is a logic 1, then the output is a logic 1. For the cases where mux 26 outputs a D' signal, the D signal may first be passed through combinational logic comprising an inverter 71 possibly defined elsewhere in another LE. As will be illustrated in more detail below, as more inputs to the logic function are shifted to the possible output selections of the function, the output logic grows more complex and more combinational logic is required to generate the output signals. It will be further apparent to one of ordinary skill in the art that it is possible to shift the inputs of unsimplified logic functions without those inputs appearing at any of the possible output selections of the function. Thus, for these cases, the LUTs could be reduced by simply removing the unused inputs from the logic functions.

Figures 10, 11, 12, 13:
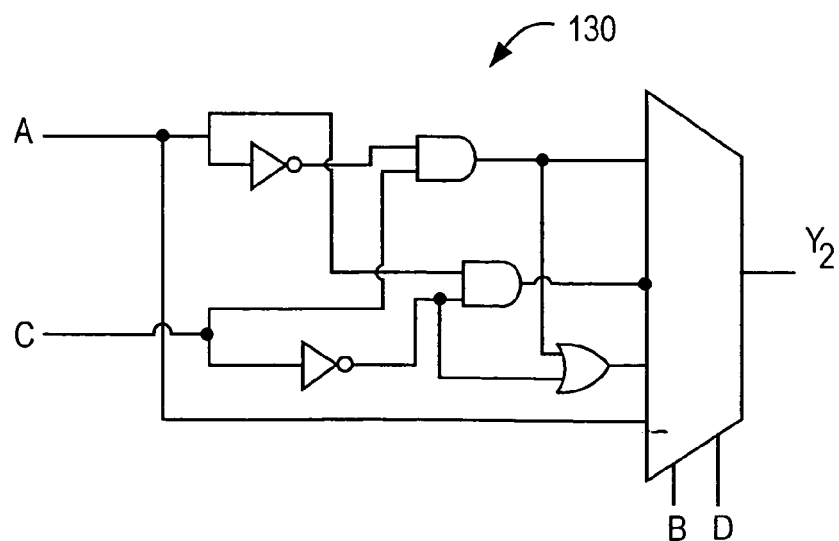
FIG. 10 is a Karnaugh map for yet still another optimized form of the example logic function.
FIG. 11 is another representation of the Karnaugh map shown in FIG. 8.
FIG. 12 is a Karnaugh map for yet further still another optimized form of the example logic function.
FIG. 13 is a logic diagram of the multiplexer that implements the logic function represented in FIG. 12.

Like the example above in which input D is shifted to the possible output selections of the logic function, the logic function could be similarly optimized by shifting any one of the other inputs of the logic function. In terms of implementation, this optimization is performed by shifting the select bits of the mux to the input bits of the mux, and subsequently processing the shifted select bits with combinational logic as required. FIGS. 8–10 show K-maps 80, 90, and 100 for the cases where inputs C, B, and A, respectively, are shifted to at least one of the possible output selections of the logic function. The optimized logic expressions for these cases are given below.

$$Y=A'D'(C)+AD(C')+AB(C')+ABD \quad (1)$$

$$Y=A'CD'(1)+AC'D(1)+AC'(B)+AD(B)$$

$$Y=CD(A')+C'D(A)+BC'(A)+BD(A)$$

With the exception of the case where input B is shifted, all of the other cases require an inverted version of the shifted input signal in at least one of the possible output selections. Thus, the case where input B is shifted would be the optimal choice of the four since it would require the fewest gates or transistors to implement.

It is understood that each of the K-maps for these optimized expressions are not unique representations of each expression. For example, FIG. 11, like FIG. 8, shows K-map 110 where the C input has been shifted but where the different permutations of B and D inputs are presented along the x-axis. In terms of the method of logic optimization described in accordance with the invention, there is no difference between these two representations.

It is further possible to shift more than one input of the logic function to the possible output selections of the logic function. FIG. 12 shows K-map 120 for an optimized form of the example logic expression where two select bits—A and C—to mux 18 are shifted to the inputs of the mux which represent the output of the expression. FIG. 13 shows logic diagram representation 130 of this optimized function where select bits A and C are shifted. It should be noted that FIG. 13 is merely a schematic diagram and that in reality, the combinational logic and multiplexer could be implemented in a separate logic region of MPLD base device 10. Looking at the logic outputs of the K-map, it is apparent that more combinational logic is required to generate each multiplexer input when the A and C select bits are shifted to the input than when either A or C alone are shifted. However, it is possible that the total number of gates needed to implement this particular LUT—the number of gates for combinational logic together with the number of gates for the multiplexer—is less than the case where only one select bit was shifted. Of course, the precise number of gates required to implement the combinational logic and multiplexer further depends on the topology or the style of logic that is actually implemented in the MPLD.

Generally speaking, a logic function expressed as a Boolean equation with n inputs can be implemented as a multiplexer with $2^{(n-t)}$ inputs and n–t select bits, where n represents the number of select bits and t represents the number of select bits shifted to the input of the multiplexer. As the number of shifted select bits increases, however, the number of total gates that are reduced decreases in part due to the increase in the number of transistors that are needed to construct the combinational logic for the function. It is possible that the optimization of a logic function could reach a critical point, at which point further optimization would result in an increase in number of total gates required to implement the function.

Thus, as illustrated by the above examples, logic reduction in a LUT can be achieved by selectively shifting the inputs of the logic function performed by the LUT to the possible output selections of the function, thereby reducing the size of the mux needed to implement the LUT and reducing the total number of logic gates needed to perform the logic function. By using fewer or smaller LUTs and LEs in a MPLD, smaller MPLDs that offer equal logic processing capability may be produced. This optimization may also enhance the performance of the device because of decreased propagation delay, distortion, and/or power loss in the logic signals. Finally, because there are fewer total gates in the device, less power is consumed by the MPLD.

The above-described logic optimization method may be carried out during the synthesis of a MPLD or other non-reprogrammable logic device from a preexisting circuit design. Use of CAD and other similar tools in such design processes is well known. Furthermore, manufacturing technologies that are known make it possible to design non-reprogrammable logic devices whereby the inputs to the logic elements that implement logic functions can be easily configured to be routed to either the inputs of the logic functions or to the possible output selections of the functions.

The logic optimization method described in the present invention may also relate to other areas of a non-reprogrammable logic device besides the look-up table. Alternatively, the method may be similarly applied to other areas of the non-reprogrammable logic device where logic functions are implemented. The invention could also be applied to non-reprogrammable or one-time programmable logic devices other than MPLDs such as laser programmable devices or other fuse or anti-fuse based devices.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A method for reducing the number of gates of a logic block that performs a first logic function in a non-reprogrammable logic device, the logic block being functionally equivalent to a second logic function, the method comprising:
    shifting at least one of the inputs of the first logic function to at least one of the possible output selections of the first logic function; and
    reconfiguring the logic block so that the first logic function performed by the logic block is functionally equivalent to the second logic function.

2. The method of claim 1 wherein the logic block comprises a look-up table in the non-reprogrammable logic device.

3. The method of claim 1 wherein the look-up table comprises at least one multiplexer.

4. The method of claim 1 wherein the non-reprogrammable logic device is a mask-programmable logic device.

5. The method of claim 1 wherein the non-reprogrammable logic device is a laser programmable device.

6. A non-reprogrammable logic device comprising:
    a logic block that performs a first logic function that is functionally equivalent to a second logic function, wherein:

at least one of the inputs of the first logic function is shifted to at least one of the possible output selections of the first logic function; and the logic block is reconfigured so that the performed first logic function is functionally equivalent to the second logic function.

7. The device in claim 6 wherein the logic block comprises a look-up table.

8. The device in claim 7 wherein the look-up table comprises at least one multiplexer.

9. The device in claim 6 wherein the non-reprogrammable logic device is a mask-programmable logic device.

10. The device in claim 6 wherein the non-reprogrammable logic device is a laser programmable device.

11. A method for reducing the size of a look-up table using a multiplexer in a non-reprogrammable logic device, the look-up table performing a first logic function that is functionally equivalent to a second logic function, the method comprising:

removing at least one of the select bits of the multiplexer; and combining the at least one removed select bit with the input bits of the multiplexer so that the first logic function performed by the look-up table is functionally equivalent to the second logic function.

12. The method in claim 11 wherein the non-reprogrammable logic device is a mask-programmable logic device.

13. The method in claim 11 wherein the non-reprogrammable logic device is a laser programmable device.

14. A non-reprogrammable logic device comprising:

a multiplexer programmed as a look-up table that performs a first logic function, wherein:

at least one of the select bits is removed from the multiplexer and combined with the input bits of the multiplexer so that the first logic function performed by the look-up table is functionally equivalent to a second logic function.

15. The device in claim 14 wherein the non-reprogrammable logic device is a mask-programmable logic device.

16. The device in claim 14 wherein the non-reprogrammable logic device is a laser programmable device.

* * * * *